United States Patent [19]
Chiu

[11] Patent Number: 5,140,551
[45] Date of Patent: Aug. 18, 1992

[54] NON-VOLATILE DYNAMIC RANDOM ACCESS MEMORY ARRAY AND THE METHOD OF FABRICATING THEREOF

[76] Inventor: Te-Long Chiu, 1188 Spring Hill Way, San Jose, Calif. 95120

[21] Appl. No.: 497,391

[22] Filed: Mar. 22, 1990

[51] Int. Cl.⁵ .............................................. G11C 11/40
[52] U.S. Cl. ................................. 365/185; 365/149; 365/218; 357/23.5; 357/23.6
[58] Field of Search ..................... 365/149, 185, 218; 357/23.5, 23.6

[56] References Cited

U.S. PATENT DOCUMENTS 4,813,018 3/1989 Kobayashi et al. ................. 365/185
5,075,888 12/1991 Yamauchi et al. ................... 365/185

FOREIGN PATENT DOCUMENTS 1-204295 8/1989 Japan ................................... 365/185
2-27593 1/1990 Japan .................................... 365/185

Primary Examiner—Joseph E. Clawson, Jr.

[57] ABSTRACT

The present invention relates to a non-volatile dynamic random acess memory cell having a dynamic random access memory cell and an electrically-erasable and electrically-programmable memory device connected on the opposite sides of an insolation device. It also relates to a memory array of the non-volatile dynamic random access memory cells and the method of fabricating the same.

14 Claims, 10 Drawing Sheets

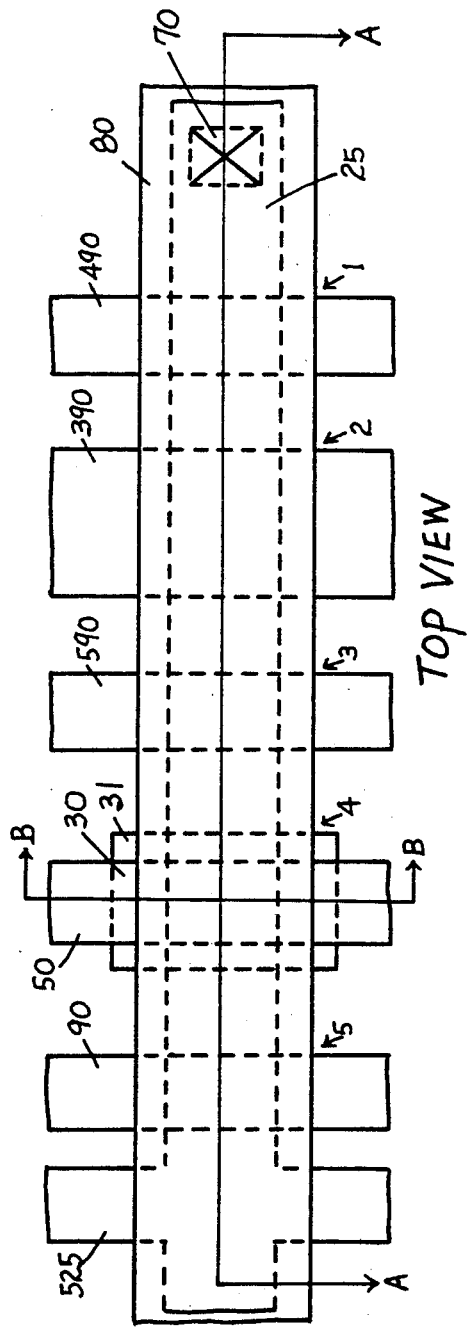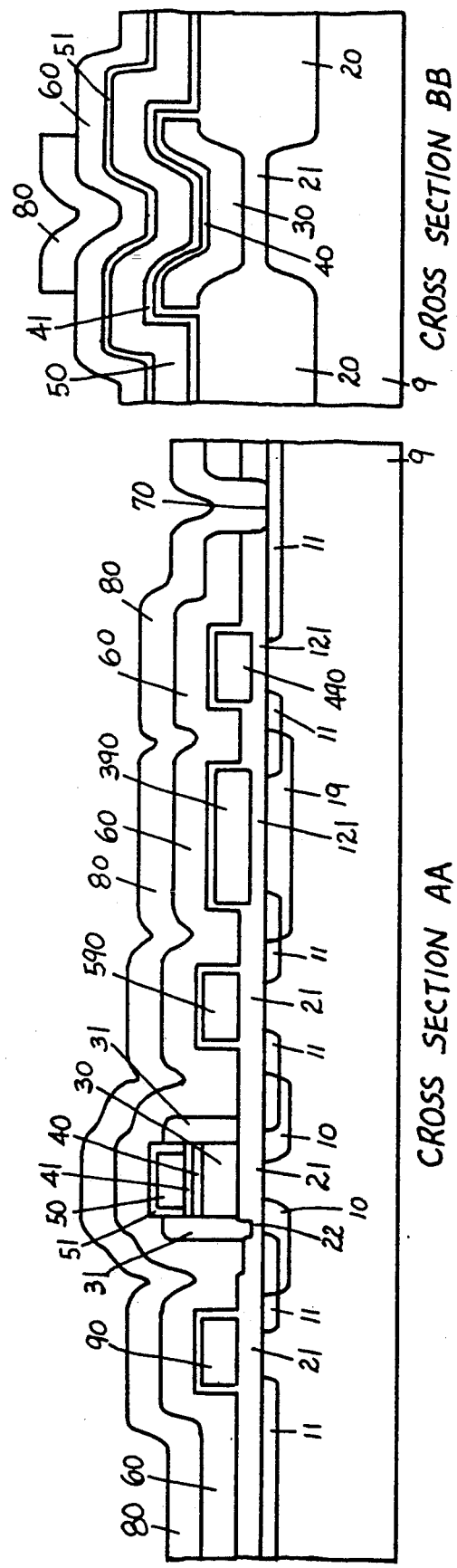
FIGURE 5

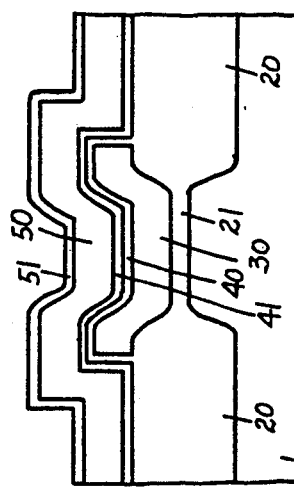
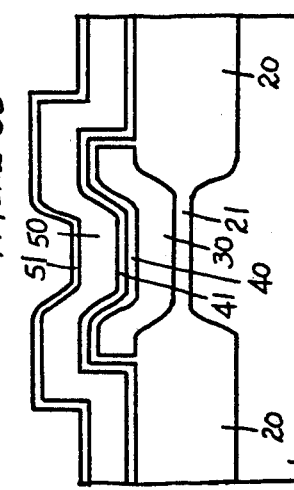
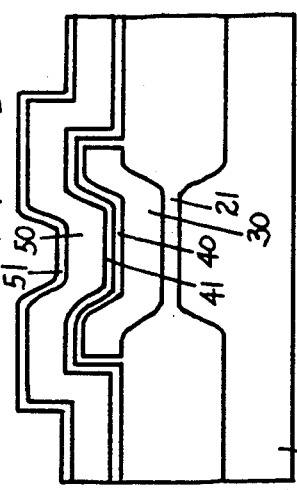
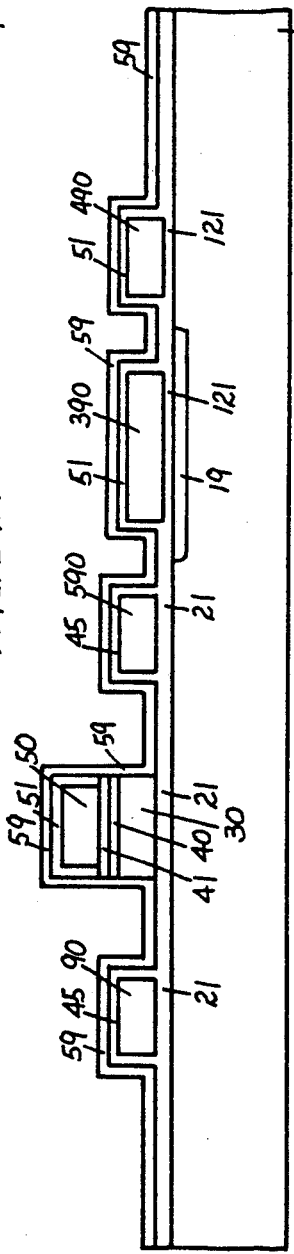

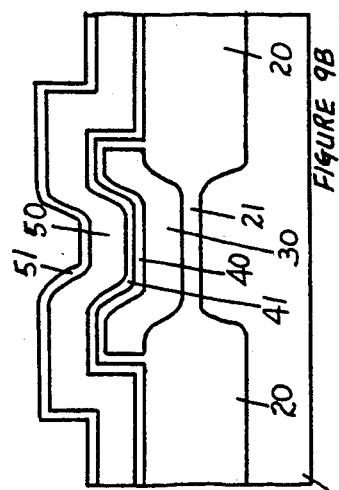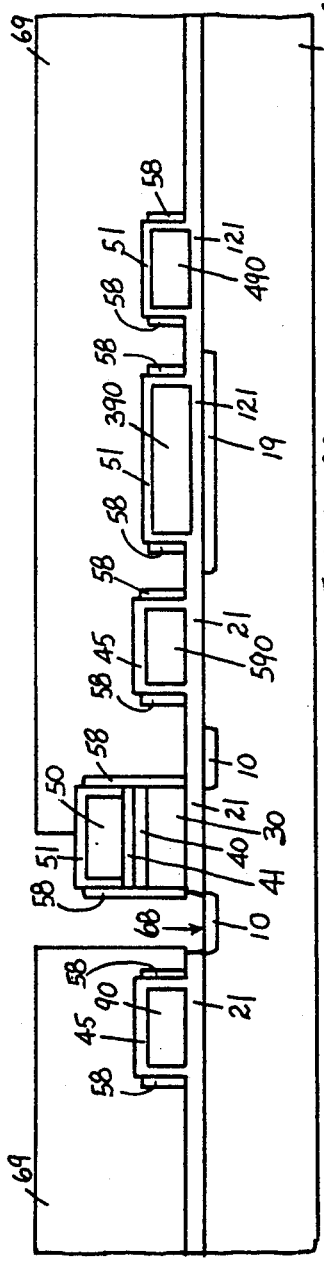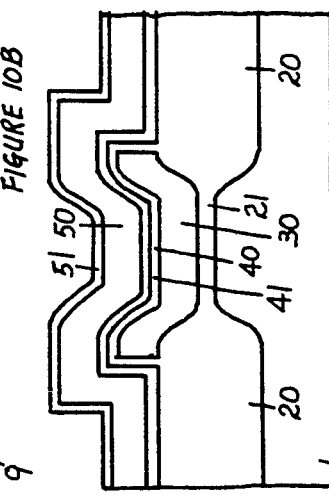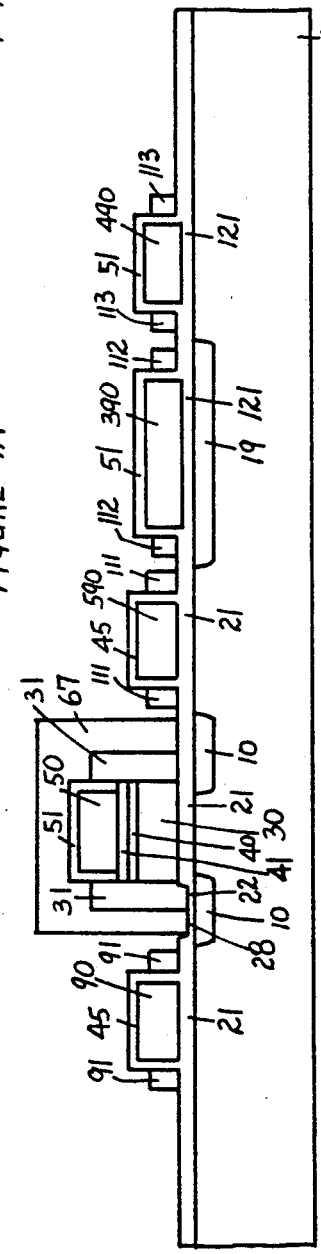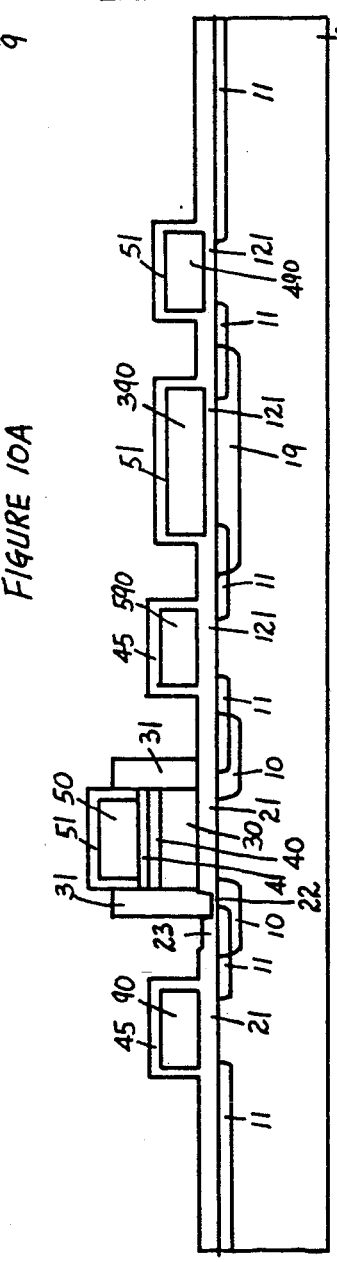

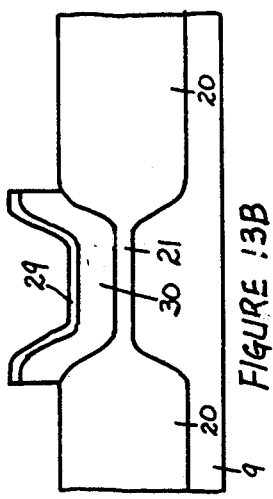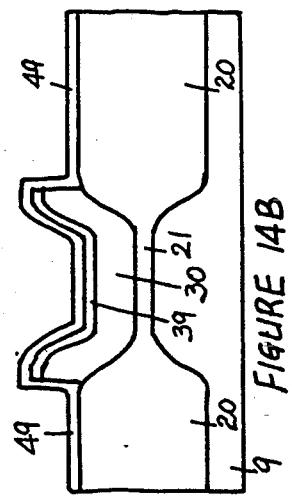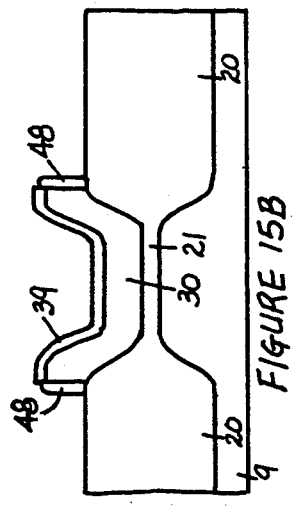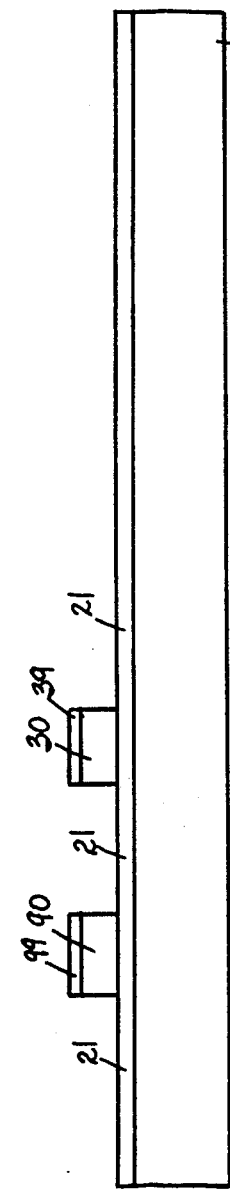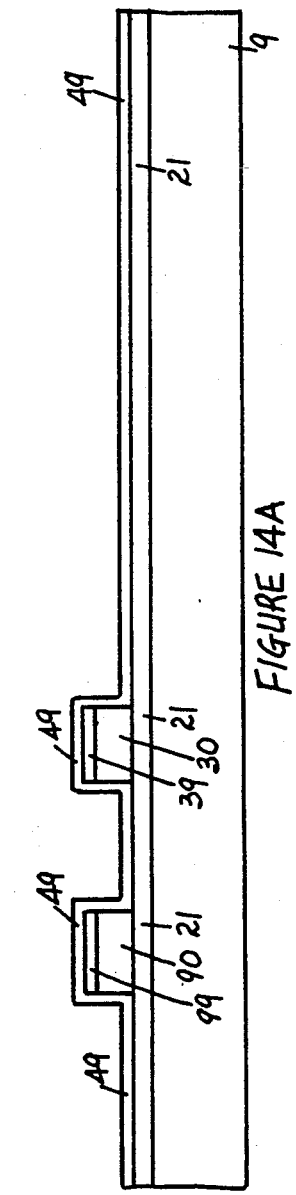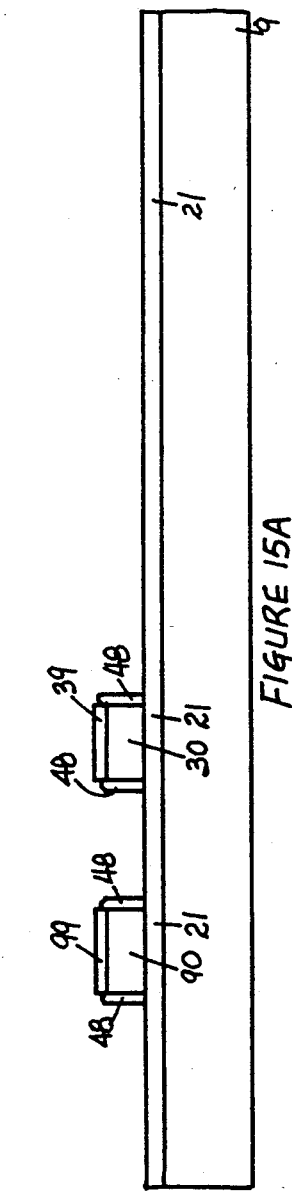

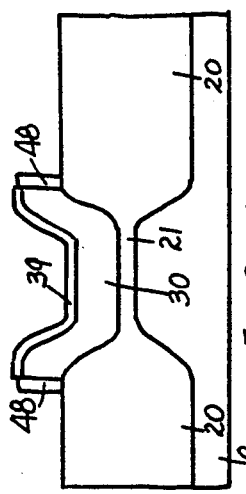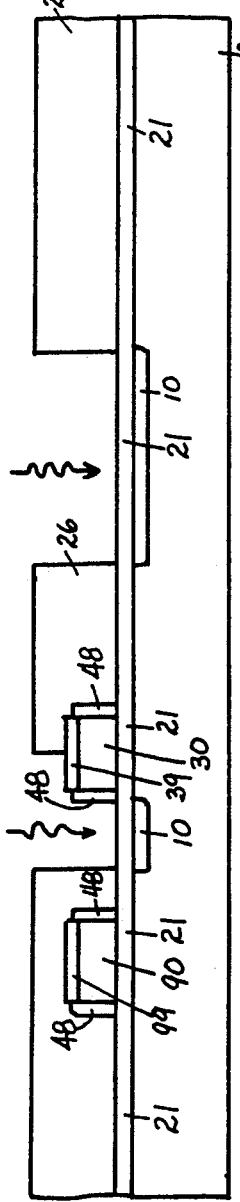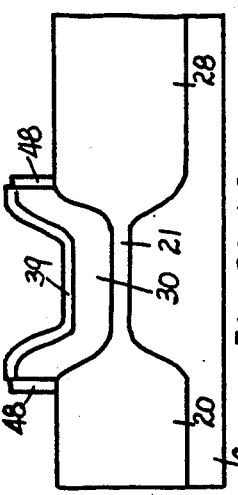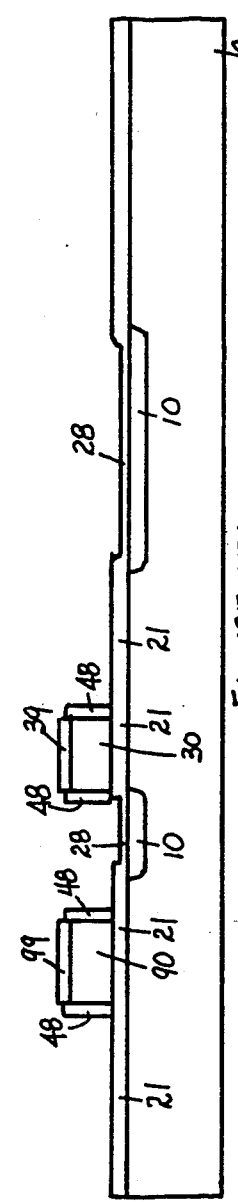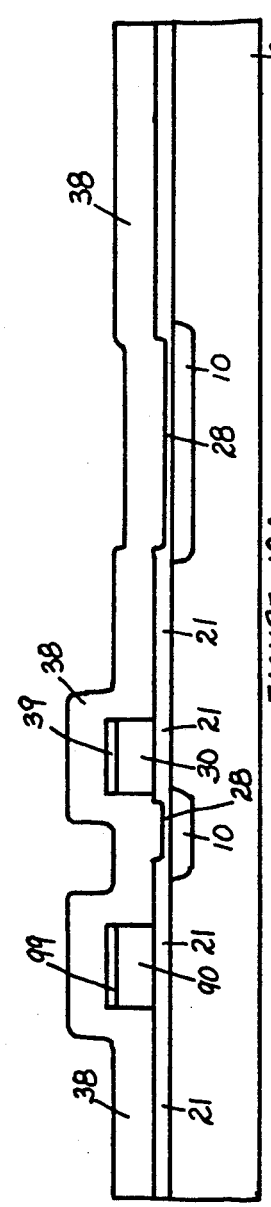

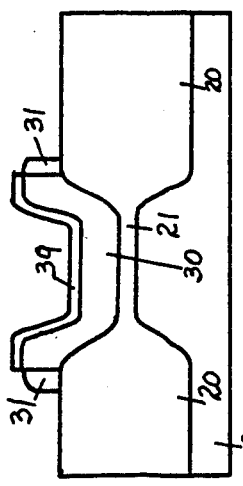
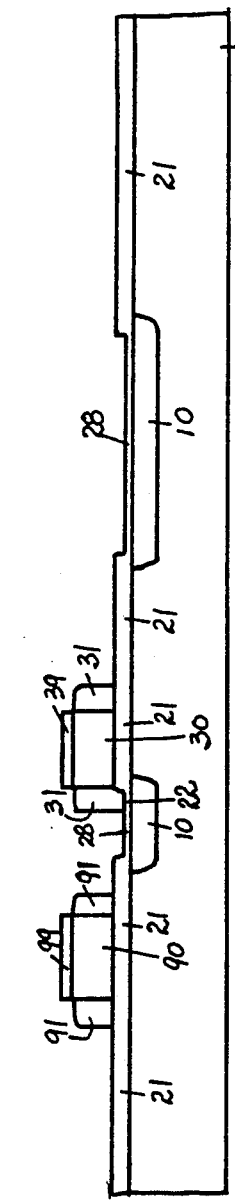
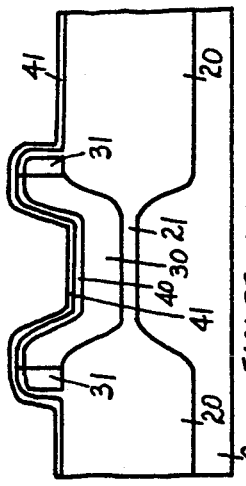
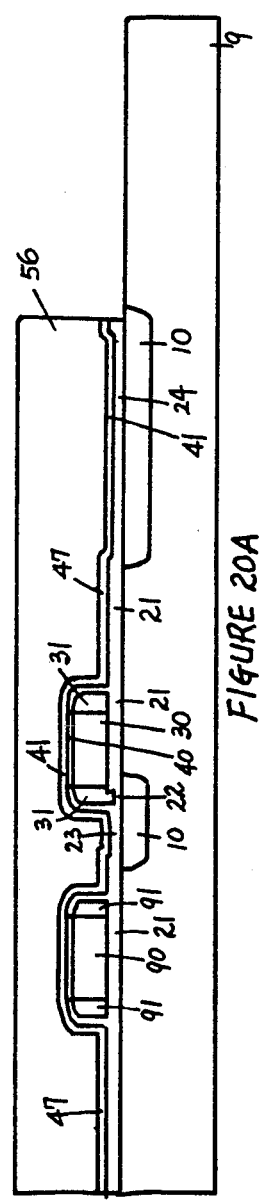
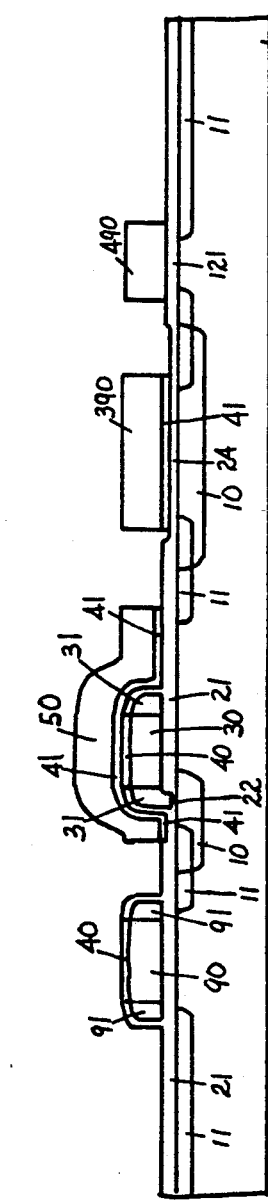

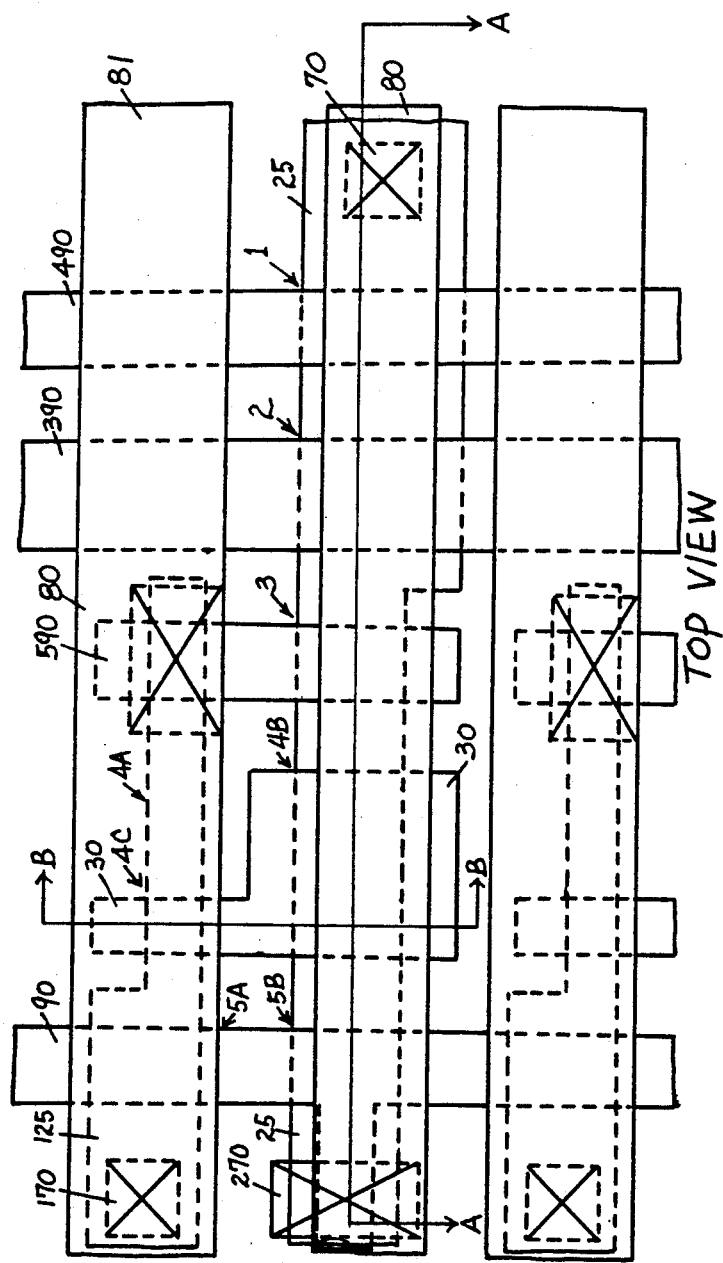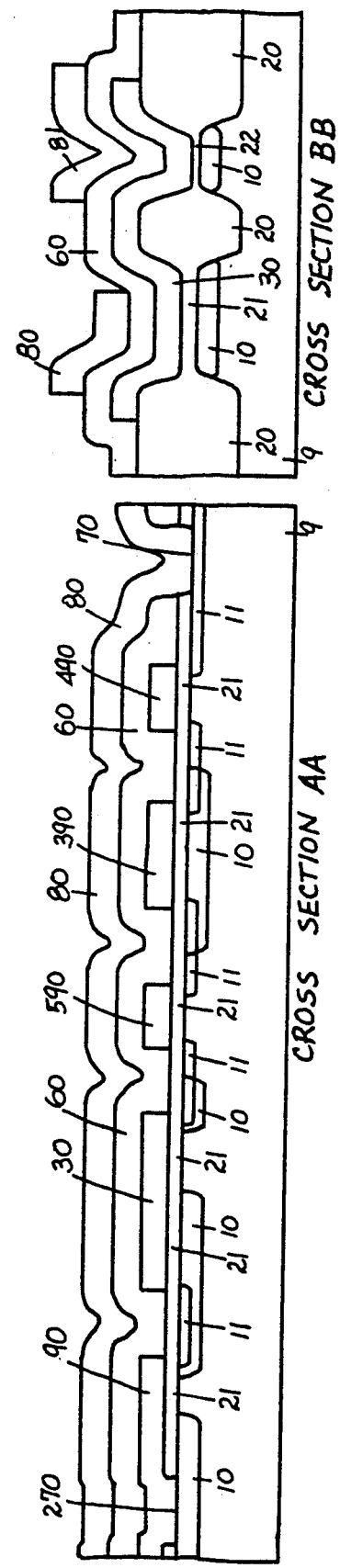
FIGURE 22

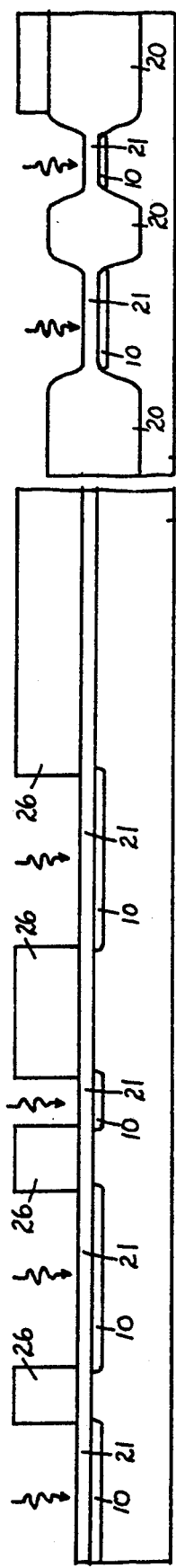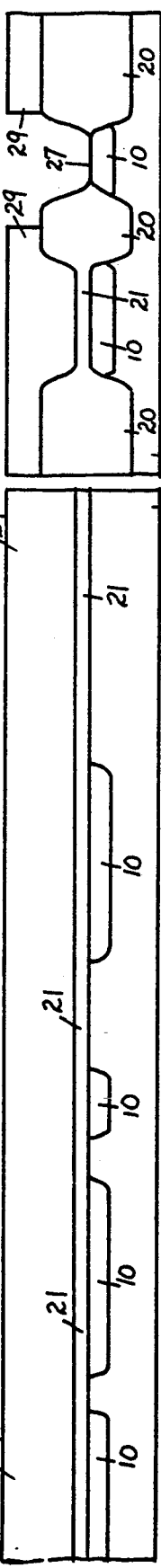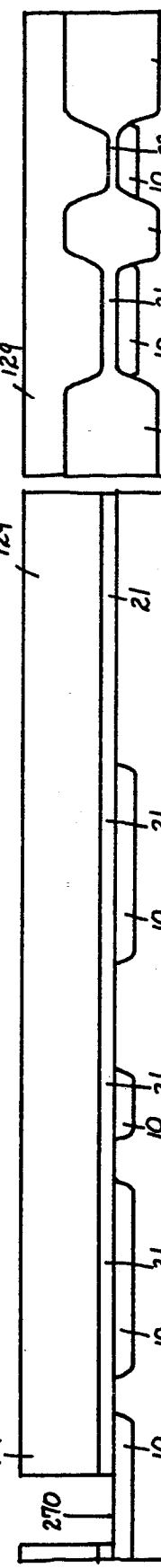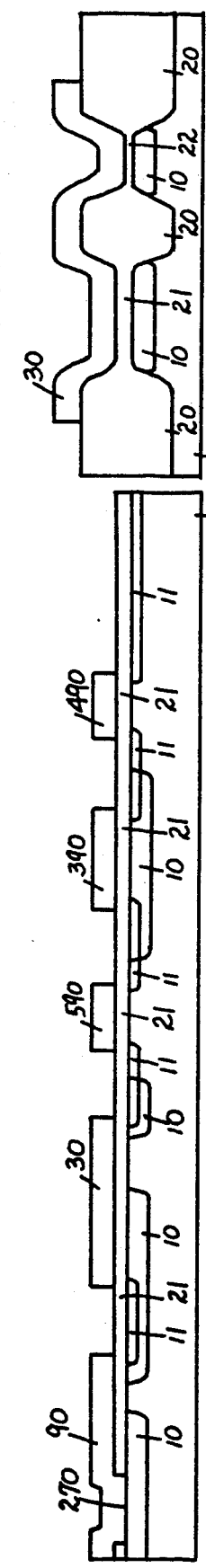

NON-VOLATILE DYNAMIC RANDOM ACCESS MEMORY ARRAY AND THE METHOD OF FABRICATING THEREOF

TECHNICAL FIELD

The present invention relates to a non-volatile dynamic random acess memory cell having a dynamic random access memory cell and an electrically-erasable and electrically-programmable memory device connected on the opposite sides of an isolation device. It also relates to a memory array of the non-volatile dynamic random access memory cells and the method of fabricating the same.

BACKGROUND ART

Since the invention of non-volatile memory cells having both electrically erasable and electrically programmable capabilities as disclosed in U.S. Pat. No. 4,115,914 issued to Harari on Sept. 26, 1978; U.S. Pat. No. 4,203,158 issued to Frohman-Bentchkowsky et al on May 13, 1980, the commercial production of EEPROMs and Non-volatile RAMs that employ the thin tunnel dielectrics for electrically erasing and electrically programming has gradually become a reality. The Non-volatile RAM is the hybrid of a static random access memory cell and the non-volatile elements. It functions as the static random access memory under normal condition and it transfers the memory stored at the static random access memory cell to the non-volatile elements automatically when the power falls below certain limit. As the power recovers, it automatically transfers the memory from the non-volatile elements back to the static random access memory cell. One disadvantage of the Non-volatile RAM is its large cell size inherited from the static random access memory cell.

DISCLOSURE OF THE INVENTION

It is therefore the principle object of this invention to provide an improved version of the Non-volatile RAM. The proposed version of the Non-volatile RAM is the Non-volatile DRAM that has much smaller cell size. The Non-volatile DRAM cell has a dynamic random access memory cell and an EEPROM cell connected on the opposite sides of an isolation device. During the normal operation condition with stable power, the gate of the isolation device is grounded and the DRAM cell is completely isolated from the EEPROM cell. Therefore, the Non-volatile DRAM cell functions exactly as the DRAM cell. When the sensing circuit detects that power falls below certain limit, the gate of the isolation device and the control gate of the EEPROM cell go to a suitable high potential while the select gate of the EEPROM cell is still grounded. If the DRAM cell stores certain voltage at the storage capacitor, then the voltage across the tunnel dielectric of the EEPROM cell is not high enough to cause the tunneling of charge carriers to the floating gate of the EEPROM cell, and the threshold voltage of the EEPROM cell remains at a low value. On the other hands, if the DRAM cell stores zero volts at the storage capacitor, then the voltage accross the tunnel dielectric of the EEPROM cell is high enough to cause the tunneling of charge carriers to the floating gate of the EEPROM cell, and the threshold voltage of the EEPROM cell goes to a high value. As the power recovers, the drain, the select gate, and the control gate of the EEPROM, and the gate of the isolation device go to a suitable voltage. The storage capacitor of the DRAM cell will be charged to certain voltage as before, if the threshold voltage of the EEPROM cell is at a low value. On the other hands, the storage capacitor of the DRAM cell remains at zero volts as before, if the threshold voltage of the EEPROM cell is at a high value. After the charge is restored, the gate of the isolation device goes to ground potential and the DRAM cell is isolated from the EEPROM cell. To reset the EEPROM cell to its initial state, apply suitable high voltages to the drain and the select gate of the EEPROM cell while grounding the control gate of the EEPROM cell and the gate of the isolation device. By so doing, the threshold voltage of the EEPROM cell is restored to the low value.

It is another object of this invention to provide a high density Non-volatile DRAM array that is identical to the DRAM memory array during normal operation.

It is another object of the present invention to provide the methods of fabricating the Non-volatile DRAM memory array in accordance to three preferred embodiments of the present invention.

BRIEF DESCRIPTION OF THE DRAWINGS

The novel features of the invention are set forth in the appended claims. The invention itself and other features as well as advantages thereof, can best be understood by reference to the detailed description which follows, read in conjunction with the accompanying drawings, wherein:

FIG. 5 is the top view and the cross section view along AA and BB of a pair of Non-volatile DRAM cells and implemented with the high density self-aligned EEPROM cells with self aligned tunnel dielectric area in accordance with the first preferred embodiment of the present invention; and FIG. 6A and FIG. 6B are the cross section view along AA and BB illustrate the oxidation after the second poly silicon control gate formation during the front end processing steps in accordance with the first preferred embodiment of the present invention; and FIG. 7A and FIG. 7B are the cross section view along AA and BB illustrate the first poly silicon etch with photoresist patterns protecting the first poly silicon devices in accordance with the first preferred embodiment of the present invention; and FIG. 8A and FIG. 8B are the cross section view along AA and BB illustrate the sealing nitride deposition after the first poly silicon floating gate formation in accordance with the first preferred embodiment of the present invention; and FIG. 9A and FIG. 9B are the cross section view along AA and BB illustrate the oxide removal from the tunnel dielectric area in accordance with the first preferred embodiment of the present invention; and FIG. 10A and FIG. 10B are the cross section view along AA and BB illustrate the photoresist protecting the new floating gate that consists of the add-on poly silicon at the sidewall of the first poly silicon floating gate, during the removal of all add-on poly silicon at the sidewall of all other poly silicon patterns in accordance with the first preferred embodiment of the present invention; and FIG. 11A and FIG. 11B are the cross section view along AA and BB illustrate the new floating gate that consists of the add-on poly silicon at the sidewall of the first poly silicon floating gate in accordance with the first preferred embodiment of the present invention.

FIG. 13A and FIG. 13B are the cross section view along AA and BB illustrate the first poly silicon floating gate formation stage during the front end processing steps in accordance with the second preferred embodiment of the present invention; and FIG. 14A and FIG. 14B are the cross section view along AA and BB illustrate the sealing nitride deposition after the first poly silicon floating gate formation in accordance with the second preferred embodiment of the present invention; and FIG. 15A and FIG. 15B are the cross section view along AA and BB illustrate the formation of the sealing nitride at the sidewall of the first poly silicon floating gate in accordance with the second preferred embodiment of the present invention; and FIG. 16A and FIG. 16B are the cross section view along AA and BB illustrate the impurity implant to form the buried source and buried drain for the EEPROM in accordance with the second preferred embodiment of the present invention; and FIG. 17A and FIG. 17B are the cross section view along AA and BB illustrate the tunnel dielectric formation in accordance with the second preferred embodiment of the present invention; and FIG. 18A and FIG. 18B are the cross section view along AA and BB illustrate the add-on poly silicon deposition after the removal of the sealing nitride from the sidewall of the first poly silicon floating gate in accordance with the second preferred embodiment of the present invention; and FIG. 19A and FIG. 19B are the cross section view along AA and BB illustrate the formation of the add-on poly silicon at the sidewall of the first poly silicon floating gate to form the new floating gate in accordance with the second preferred embodiment of the present invention; and FIG. 20A and FIG. 20B are the cross section view along AA and BB illustrate the removal of the interpoly dielectric in the second poly silicon gate device area in accordance with the second preferred embodiment of the present invention; and FIG. 21A and FIG. 21B are the cross section view along AA and BB illustrate the formation of the second poly control gate in accordance with the second preferred embodiment of the present invention; and FIG. 22 is the top view and the cross section view along AA and BB of a single poly silicon Non-volatile DRAM cell and implemented with a single poly silicon EEPROM in accordance with the third preferred embodiment of the present invention; and FIG. 23A and FIG. 23B are the cross section view along AA and BB illustrate the buried N+ formation step in accordance with the third preferred embodiment of the present invention; and FIG. 24A and FIG. 24B are the cross section view along AA and BB illustrate the tunnel dielectric formation step in accordance with the third preferred embodiment of the present invention; and FIG. 25A and FIG. 25B are the cross section view along AA and BB illustrate the buried contact formation step in accordance with the third preferred embodiment of the present invention; and FIG. 26A and FIG. 26B are the cross section view along AA and BB illustrate the poly silicon gate formation step in accordance with the third preferred embodiment of the present invention.

DETAILED DESCRIPTION OF THE PREFERRED EMBODIMENTS

Figure 1:
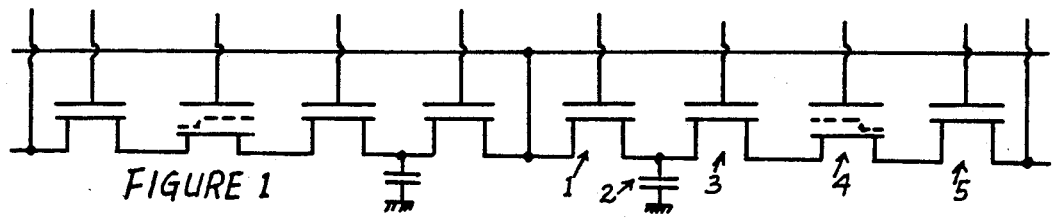
FIG. 1 shows one pair of Non-volatile DRAM cells in accordance with the first embodiment of the present invention.

The first preferred embodiment of the Non-volatile DRAM cell in accordance with the present invention is shown in FIG. 1. The Non-volatile DRAM cell has a DRAM with the access transistor 1 and the storage capacitor 2, an EEPROM with the access transistor 5 and the memory device 4, and an isolation transistor 3 between the DRAM and the EEPROM. For the convenience of explanation, an N-channel Non-volatile DRAM will be used as an example. The N-channel Non-volatile DRAM with the gate of the N-channel isolation transistor 3 grounded functions exactly like the ordinary N-channel DRAM when the power is stable. However, when the sensing circuit detects that power falls below certain limit, the gate of the N-channel isolation transistor 3 and the control gate of the N-channel memory device 4 will immediately go to a suitable high positive potential while the select gate of the N-channel access transistor 5 remains at ground potential. If the DRAM cell stores a positive voltage at the storage capacitor 2, then the positive voltage across the tunnel dielectric of the N-channel memory device 4 is not high enough to cause the tunneling of electrons to the floating gate, and the threshold voltage of the N-channel memory device 4 remains at a negative value. On the other hands, if the N-channel DRAM stores zero volts at the storage capacitor 2, then the voltage across the tunnel dielectric of the N-channel memory device 4 is high enough to cause the tunneling of electrons to the floating gate, and the threshold voltage of the N-channel memory device 4 goes to a positive value. As the power recovers, the drain, the select gate, and the control gate of the N-channel EEPROM as well as the gate of the isolation transistor 3 all go to a positive value. If the threshold voltage of the N-channel memory device 4 is at a negative value, the storage capacitor 2 will be charged to a positive value. On the other hand, if the threshold voltage of the N-channel memory device 4 is at a positive value, then the storage capacitor 2 will remain at zero volts. Thus the voltage at the storage capacitor 2 before the power fell below certain limit is recovered. After the voltage at the storage capacitor 2 is restored, the gate of the N-channel isolation transistor 3 goes to the ground potential to isolate the N-channel DRAM from the N-channel EEPROM. To reset the N-channel memory device 4 to its initial state, a suitable high positive voltage is applied to the drain and the select gate of the N-channel access transistor 5 while grounding the control gate of the memory device. By so doing, the threshold voltage of the N-channel memory device 4 is reset to a negative value.

Figure 2:
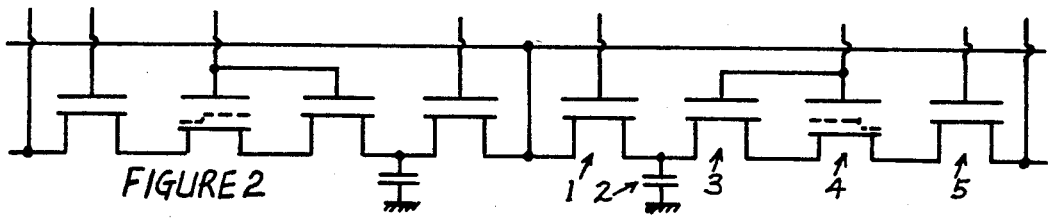
FIG. 2 shows one pair of Non-volatile DRAM cells in accordance with the second embodiment of the present invention.

The second preferred embodiment of the Non-volatile DRAM cell in accordance with the present invention is shown in FIG. 2. This Non-volatile DRAM cell has a DRAM with the access transistor 1 and the storage capacitor 2, an EEPROM with the access transistor 5 and the memory device 4, and an isolation transistor 3 with its gate shorted to the control gate of the memory device 4 separating the DRAM from the EEPROM. The principle of operation of this Non-volatile DRAM is identical to that of the first preferred embodiment of the Non-volatile DRAM.

Figure 3:
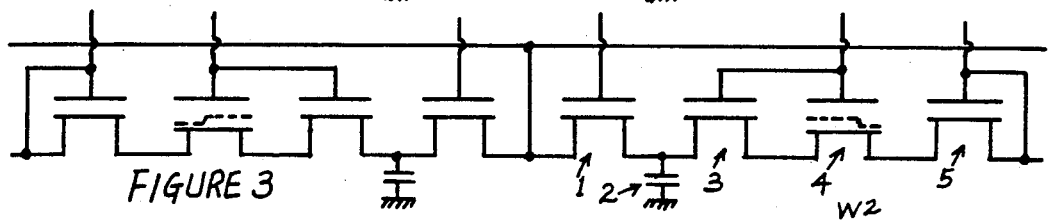
FIG. 3 shows one pair of Non-volatile DRAM cells in accordance with the third embodiment of the present invention.

The third preferred embodiment of the Non-volatile DRAM cell in accordance with the present invention is shown in FIG. 3. This Non-volatile DRAM cell has a DRAM with the access transistor 1 and the storage capacitor 2, an EEPROM consists of the memory device 4 and the access transistor 5 with its drain shorted to the select gate, and an isolation transistor 3 with its gate shorted to the control gate of the memory device 4 separating the DRAM and the EEPROM.

Figure 4:
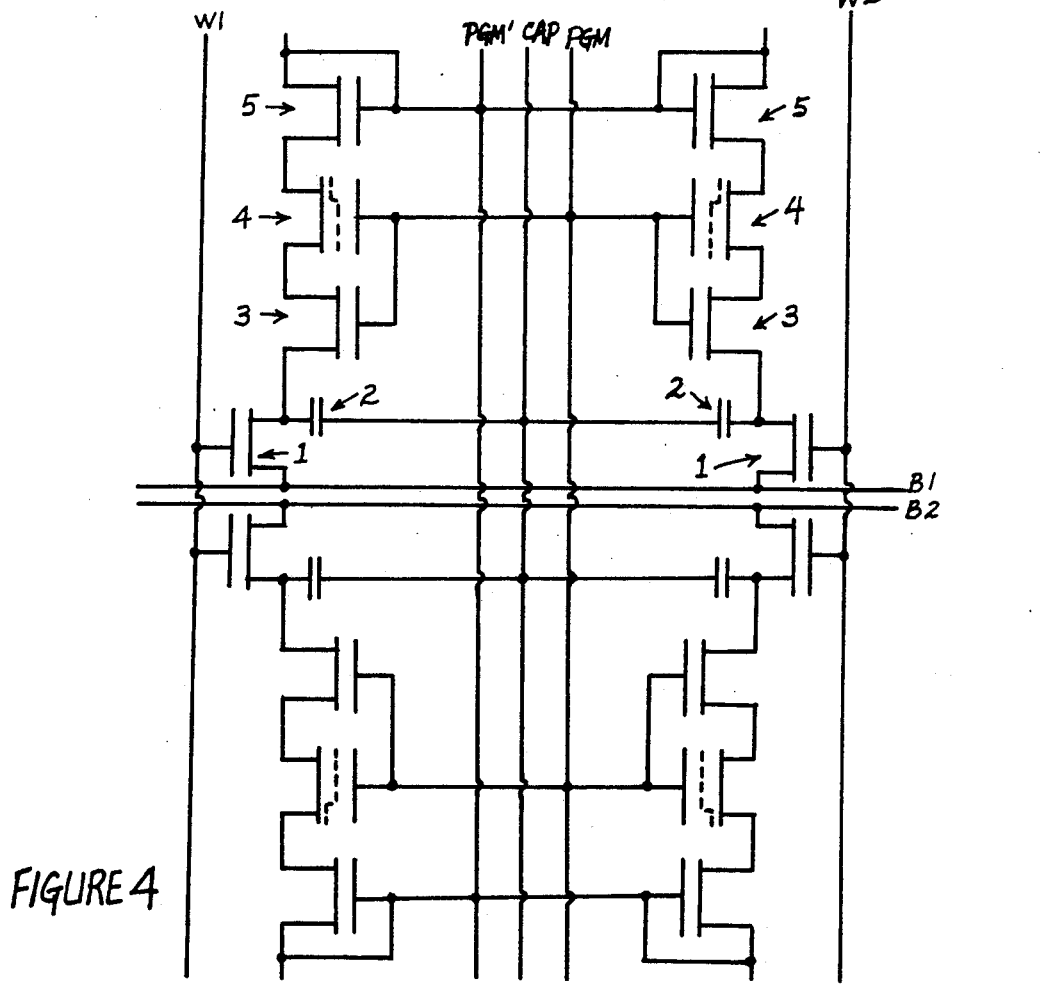
FIG. 4 shows the Non-volatile DRAM array constructed with the Non-volatile DRAM cells in FIG. 3.

FIG. 4 shows how the Non-volatile DRAM cells of the third preferred embodiment of the present invention can be connected into a Non-volatile DRAM memory array. As in the ordinary DRAM array, the drain of all the access transistors 1 at the same row are connected to the same bit line as B1 and B2, the gate of all the access transistors 1 at the same column are connected to the same word line as W1 and W2, and all capacitors 2 are connected to the same CAP line. In addition, the control gate of all memory devices 4 and the gate of all isolation transistors 3 are connected to the same PGM line, and the drain and the gate of all access transistors 5 are connected to the same PGM' line. The operation of the DRAM array in this Non-volatile DRAM memory array is identical to that of the ordinary DRAM array. When the power monitor sensing circuit on the same chip detects that the power falls below certain limit, a suitable high potential is applied to the PGM line while the PGM' line is held at the ground potential. The voltage state at each DRAM storage capacitor 2 are thus stored in the memory device 4 of the same Non-volatile DRAM cell. As the power recovers, a suitable voltage is applied to the PGM line and PGM' line while the gate of the access transistor 1 is grounded and the CAP line stays at a suitable potential. After the voltage state at the storage capacitor 2 is restored, the PGM line and the PGM' line go back to the ground potential. Then the PGM' line goes to a suitable high potential while the PGM line is still held at the ground potential to reset all the memory devices 4 to the initial normally-on state.

Figure 12:
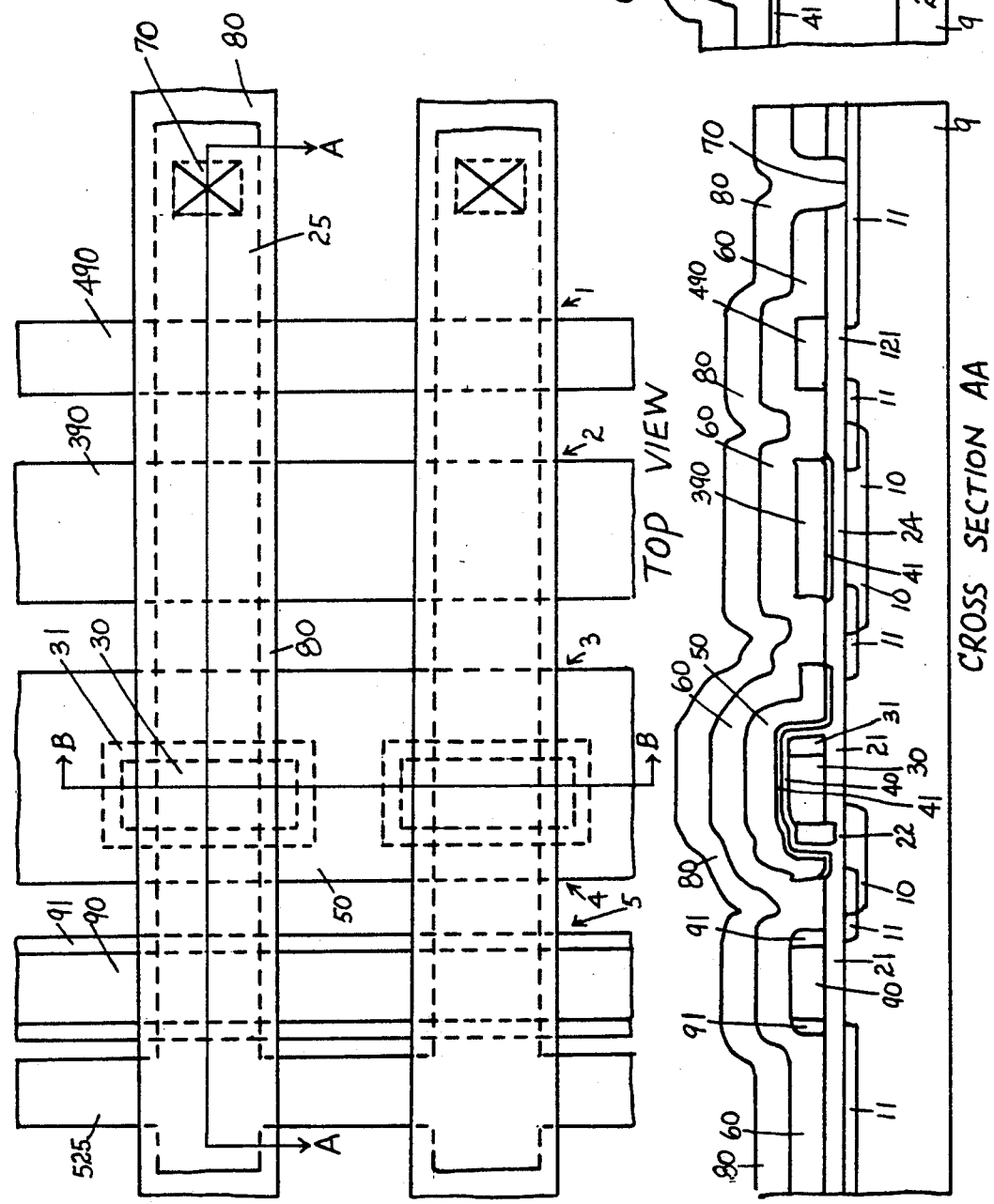
FIG. 12 is the top view and the cross section view along AA and BB of a pair of Non-volatile DRAM cells and implemented with the high density non-self-aligned EEPROM memory cells with self aligned tunnel dielectric area in accordance with the second embodiment of the present invention.

The Non-volatile DRAM of the first preferred embodiment of the present invention is implemented with the self-aligned double poly silicon fabrication processes as shown in FIG. 5. The Non-volatile DRAM of the second preferred embodiment of the present invention is implemented with the non-self aligned double poly silicon fabrication processes as shown in FIG. 12. The Non-volatile DRAM of the third preferred embodiment of the present invention is implemented with the single poly silicon fabrication processes as shown in FIG. 22.

FIG. 5 shows the top view and the cross section view along AA and BB of the Non-volatile DRAM of the first preferred embodiment of the present invention that is implemented with the self-aligned double poly silicon fabrication processes. The Non-volatile DRAM consists of the EEPROM with the access transistor 5 and the memory device 4, the DRAM with access transistor 1 and the storage capacitor 2, and the isolation transistor 3 separating the EEPROM and the DRAM. The N-channel Non-volatile DRAM is constructed on a P-type substrate 9 of monocrystalline silicon or the like. The memory device 4 includes a floating gate 30 disposed over the channel area and separated from the channel area by gate oxide 21, an add-on floating gate 31 shorted electrically to the floating gate 30 and disposed over the buried drain and separated from the buried drain by the tunnel dielectric 22, a control gate 50 disposed over the floating gate 30 and separated from the floating gate 30 by interpoly dielectric 40 and 41, and buried N+ junction 10 serving as the buried source and the buried drain of the memory device 4. The buried source 10 and the buried drain 10 are disposed under the add-on floating gate 31. The add-on floating gate 31 is disposed at the sidewall of the control gate 50 and insulated from the control gate 50. The shallower junction 11 forms the source drain of the periphery transistors. The access transistor 5 includes a select gate 90 disposed over and insulated from the substrate between the source and the drain by the gate oxide 21. The storage capacitor 2 includes the capacitor plate 390 disposed over and isolated from the buried junction 19 by the thiner gate dielectric 121. The access transistor 1 includes the gate 490 disposed over and insulated from the substrate between the source and the drain by the thiner gate dielectric 121. The isolation transistor 3 includes the gate 590 disposed over and insulated from the substrate between the source and the drain by the gate oxide 21. The metal line 80 is connected to the drain of all access transistors 1 at the same row through contact 70. The drain of all acess transistors 5 are connected to the common drain diffusion line 525. The doped CVD oxide film 60 is underneath the metal to smooth out the sharp edges. The thick field oxide 20 serves as the isolation between different devices.

When a suitable potential is applied to the control gate 50 while grounding the buried drain, electrons are tunneled from the buried drain to the add-on floating gate 31 through the tunnel dielectric 22. On the other hand, when a suitable potential is applied to the buried drain while grounding the control gate 50, the electrons are tunneled from the add-on floating gate 31 to the buried drain through the tunnel dielectric 22. If there are excess electrons at the floating gate 30 and the add-on floating gate 31 of the memory device 4 of EEPROM, the positive voltage required at the control gate 50 to conduct current through the memory device 4 of EEPROM becomes higher. On the other hand, if there are deficit in electrons at the floating gate 30 and the add-on floating gate 31 of the memory device 4 of EEPROM, the positive voltage required at the control gate 50 to conduct current through the memory device 4 of EEPROM becomes less. Therefore, whether there are current or there are no current conducting through the memory device 2 of EEPROM at a given voltage at the control gate 50 can represent whether 1 or 0 is stored in the memory device 4 of EEPROM.

The fabrication of the Non-volatile DRAM shown in FIG. 5 can now be described in details. For the convenience of explanation, an N-channel Non-volatile DRAM will be used as an example. A P-type single crystal silicon will be used as the starting substrate. As in the conventional fabrication process for the N-channel EEPROM, a CVD nitride thin film is deposited on the initial oxide grown on the P-type substrate. Then the photoresist patterns of the active area is formed on top of the nitride film, and the nitride outside of the photoresist patterns is etched off. P-type impurity Boron is then implanted into the area outside of the photoresist patterns to raise the substrate doping outside of the active area. This is done to raise the threshold voltage of the parasitic field devices to form better isolation between the active areas. The photoresist patterns are stripped off after the Boron implant, and the thick field oxide 20 is grown outside of the active area. During the field oxidation, the active areas 25 and 525 are still protected by the nitride pattern and no oxide is grown. After the field oxide 20 is grown, the nitride and the initial oxide underneath the nitride in the active areas 25 and 525 are stripped off to expose the substrate in the active area only. Then a high quality gate oxide 21 of 200 A to 1000 A is grown in the active areas 25 and 525, and the photoresist patterns are formed to expose the EEPROMs area for 3E11 to 3E12/cm2 dose of boron implant. After the photoresist patterns are stripped off, the first layer of poly silicon 30, 90, and 590 is deposited and doped. The photoresist patterns are then used to pattern the first poly silicon. After the photoresist patterns are stripped, the high quality oxide 40 and 45 is grown on the first poly silicon and the high quality nitride film 41 and 46 is then deposited and oxidized. Then the photoresist patterns are formed to protect the EEPROMs area and the first poly silicon area during the removal of the nitride 45 and oxide from the second poly silicon device area. The high quality gate oxide for the second poly silicon devices is grown and the impurity implant is done to adjust the threshold of the second poly silicon devices. Then, the photoresist patterns are used to expose the storage capacitor area for the capacitor buried N+ implant at the dose of 1E12 to 1E15/cm2. After the photoresist patterns are stripped off, the second layer of poly silicon is then deposited and doped. The photoresist patterns are used to pattern the control gate 50 and the second poly silicon gate patterns 390, 490, and the periphery devices. After the photoresist is stripped off, the oxide layer 51 is grown on the second poly silicon control gate 50 and other second poly silicon patterns 390 and 490 as shown in FIG. 6A and FIG. 6B. The nitride film 46 outside of the second poly silicon control gate is then etched off. Then photoresist patterns 66 are used to expose the EEPROMs only, and the first poly silicon outside of the second poly silicon control gate is etched off as shown in FIG. 7A and FIG. 7B. After the photoresist patterns are stripped off, the sealing nitride film 59 is deposited and oxidized as shown in FIG. 8A and FIG. 8B. The anisotropic etch is used to remove all nitride except sealing nitride 58 at the sidewall of poly silicon patterns. Then the photoresist patterns are formed to expose the EEPROMs area for the buried N+ implant 10 at the dose of 5E13 to 5E15/cm2. After the photoresist patterns are stripped off, the new photoresist patterns 69 are formed to expose the tunnel dielectric area at the drain of the EEPROMs, and the oxide is etched off to expose the substrate 68 as shown in FIG. 9A and FIG. 9B. The photoresist patterns are again stripped off and the tunnel dielectric 28 is then formed. The sealing nitride at the sidewall of the floating gate 30 is then removed in hot phosphoric acid. The add-on poly silicon layer is deposited and doped. The anisotropic poly silicon etch is used to remove all add-on poly silicon film except the add-on poly silicon 31 at the sidewall of the floating gate 30 to form the add-on floating gate 31. The tunnel dielectric area 22 under the add-on floating gate 31 becomes the new small tunnel dielectric area. The photoresist patterns 67 are used to protect the EEPROM area during the removal of the add-on poly silicon from the sidewall of all other poly silicon patterns as shown in FIG. 10A and FIG. 10B. After the photoresist patterns are stripped off, the shallow source drain junction 11 is implanted and the EEPROM is as shown in FIG. 11A and FIG. 11B. The remaining fabrication process steps are similar to that of the conventional N-channel EEPROMs. After oxide is grown on the add-on poly silicon and the exposed tunnel dielectric area, doped CVD oxide film is deposited, contacts are open, and metal film is deposited and patterned.

FIG. 12 shows the top view and the cross section view along AA and BB of the Non-volatile DRAM of the second preferred embodiment of the present invention that is implemented with the non-self-aligned double poly silicon fabrication processes. The Non-volatile DRAM consists of the EEPROM with the access transistor 5 and the memory device 4, the DRAM with the access transistor 1 and the storage capacitor 2, and the isolation transistor 3 with its gate shorted to the control gate of the memory device 4 separating the EEPROM and the DRAM. The N-channel Non-volatile DRAM is constructed on a P-type substrate 9 of the monocrystalline silicon or the like. The memory device 4 includes a floating gate 30 disposed over the channel area and separated from the channel area by gate oxide 21, an add-on floating gate 31 shorted electrically to the floating gate 30 and disposed over the buried drain and separated from the buried drain by the tunnel dielectric 22, a control gate 50 disposed over the floating gate 30 and the add-on floating gate 31 and separated from these floating gate by interpoly dielectric 40 and 41, and buried N+ junction 10 serving as the buried source and the buried drain of the EEPROM. The buried source and the buried drain are disposed under the add-on floating gate 31 and disposed under the control gate 50 and separated from the control gate 50 by the interpoly dielectric 41 and an oxide layer 23. The shallower junction 11 forms the source drain of the periphery transistors. The access transistor 5 includes a select gate 90 disposed over and insulated from the substrate between the source and the drain by the gate oxide 21. The storage capacitor 2 includes the capacitor plate 390 disposed over and insulated from the buried junction 10 by the interpoly dielectric 41 and the thiner gate dielectric 24. The access transistor 1 includes the gate 490 disposed over and separated from the substrate between the source and the drain by the gate dielectric 121. Finally, the isolation transistor 3 includes the gate 50 disposed over and insulated from the substrate by the interpoly dielectric 41 and the gate dielectric 24. The metal line 80 is connected to the drain of all access transistors 1 of the DRAM at the same row through contact 70. The drain of all access transistors 5 are connected to the common drain diffusion line 525. The doped CVD oxide film 60 is underneath the metal to smooth out the sharp edges. The thick field oxide 20 serves as the isolation between different devices.

When a suitable potential is applied to the control gate 50 while gounding the buried drain, the electrons are tunneled from the buried drain to the floating gate 30 and the add-on floating gate 31 through the tunnel dielectric 22. On the other hand, when a suitable potential is applied to the buried drain while grounding the control gate 50, the electrons are tunneled from the add-on floating gate 31 to the buried drain through tunnel dielectric 22. If there are excess electrons at the floating gate 30 and the add-on floating gate 31 of the memory device 4 of the EEPROM, the positive voltage required at the control gate 50 to conduct current through the memory device 4 of EEPROM becomes higher. On the other hand, if there are deficit in electrons at the floating gate 30 and the add-on floating gate 31 of the memory device 4 of EEPROM, the positive voltage required at the control gate 50 to conduct current through the memory device 4 of the EEPROM becomes less. Therefore, whether there are current or there are no current conducting through the memory device 4 of the EEPROM at a given voltage at the control gate 50 represents whether 1 or 0 is stored in the memory device 4 of the EEPROM.

The fabrication of the Non-volatile DRAM shown in FIG. 12 can now be described in details. For the convenience of explanation, an N-channel Non-volatile DRAM will be used as an example. A P-type single crystal silicon will be used as the starting substrate. As in the conventional fabrication process for the N-channel EEPROM, a CVD nitride thin film is deposited on the initial oxide grown on the P-type substrate. Then the photoresist patterns of the active area is formed on top of the nitride film, and the nitride outside of the photoresist patterns is etched off. P-type impurity Boron is then implanted into the area outside of the photoresist patterns to raise the substrate doping outside of the active area. This is done to raise the threshold voltage of the parasitic field devices to form better isolation between the active areas. The photoresist patterns are stripped off after the Boron implant, and the thick field oxide 20 is grown outside of the active area. During the field oxidation, the active areas 25 and 525 are still protected by nitride pattern and no oxide is grown. After the field oxide 20 is grown, the nitride and the initial oxide underneath the nitride in the active areas 25 and 525 are stripped off to expose the substrate in the active area only. Then a high quality gate oxide 21 of 200 A to 1000 A is grown in the active areas 25 and 525, and the photoresist patterns are formed to expose the EEPROMs area for 3E11 to 3E12/cm2 dose of boron implant. After the photoresist patterns are stripped off, the first layer of poly silicon 30 and 90 is deposited and doped. An oxide layer 39 and 99 is then grown on the first layer of poly silicon 30 and 90. The photoresist patterns are formed to retain the floating gate 30 with the oxide 39 and the gate 90 of the access transistor with the oxide 99, and remove the poly silicon from the area outside of the photoresist patterns. After the photoresist patterns are stripped of, the cross section along AA and BB are shown in FIG. 13A and FIG. 13B. A sealing nitride film 49 is then deposited and oxidized as shown in FIG. 14A and FIG. 14B. The anisotropic etch is used to remove all nitride except sealing nitride 48 at the sidewall of the floating gate 30 and the gate 90 of the access transistor 5 as shown in FIG. 15A and FIG. 15B. Then the photoresist patterns 26 are formed to expose the EEPROMs area and the storage capacitor area for the buried N+ implant 10 at the dose of 5E13 to 5E15/cm2 as shown in FIG. 16A and FIG. 16B. After the photoresist patterns are stripped off, the new photoresist patterns are formed to expose the tunnel dielectric area at the drain of the memory device 4 of EEPROM, and the oxide is etched off to expose the substrate. The photoresist patterns are then stripped off and the tunnel dielectric 28 is then formed as shown in FIG. 17A and FIG. 17B. The sealing nitride 48 at the sidewall of the floating gate 30 and the gate 90 of the access transistor 5 is removed in hot phosphoric acid afterward. The add-on poly silicon layer 38 is deposited and doped as shown in FIG. 18A and FIG. 18B. The anisotropic poly silicon etch is used to remove all add-on poly silicon film except the add-on poly silicon 31 at the sidewall of the floating gate 30 to form the add-on floating gate 31 and the add-on poly silicon 91 at the sidewall of the gate of the access transistor 5 as shown in FIG. 19A and FIG. 19B. The tunnel dielectric area 22 under the add-on floating gate 31 becomes the new small tunnel dielectric area. The oxide layer 39 on the floating gate 30 and the oxide layer 99 on the gate of the access transistor 5 is then removed and the high quality oxide layer 40 is grown on the floating gate 30 and oxide 23 is also grown in the exposed tunnel dielectric area at the same time. The high quality nitride film 41 and 47 is deposited and oxidized afterward. Then the photoresist patterns 56 are formed to protect the EEPROM area and the first poly gate area during the removal of the nitride 41 and the oxide underneath the nitride 41 in the second poly silicon device area as shown in FIG. 20A and FIG. 20B. The high quality gate oxide for the second poly silicon devices is grown and the impurity implant is done to adjust the threshold of the second poly silicon devices. The second layer of poly silicon is then deposited and doped. The photoresist patterns are used to pattern the control gate 50 and the second poly silicon gate patterns. The control gate formation after the resist removal is shown in FIG. 21A and FIG. 21B. The remaining fabrication process steps are similar to that of the conventional N-channel EEPROMs. After the formation of second poly patterns, the shallow source drain junction 11 is implanted, doped CVD oxide film is deposited, contacts are open, and metal film is deposited and patterned.

FIG. 22 shows the top view and the cross section view along AA and BB of the Non-volatile DRAM of the third preferred embodiment of the present invention that is implemented with the single poly silicon fabrication processes. The Non-volatile DRAM consists of the DRAM with the access transistor 1 and the storage capacitor 2, the single poly silicon EEPROM with its drain shorted to the gate of the access transistor 5B, and the isolation transistor 3 with its gate shorted to the diffusion control gate line of the memory device 4B separating the DRAM and the single poly silicon EEPROM. The single poly silicon EEPROM consists of the access transistors 5A and 5B, the diffusion control gate line 4A, and the memory device 4B. The access transistor 5A is in series with the diffusion control gate 4A, and the access transistor 5B is in series with the memory device 4B. The N-channel Non-volatile DRAM is constructed on a P-type substrate 9 of monocrystalline silicon or the like. The memory transistor 4B includes a floating gate 30 disposed over the conductive channel of the memory transistor 4B, the buried N+ 10 bottom plate of the coupling capacitor at the drain, and the tunnel dielectric area 4C on the diffusion control gate line 4A. The floating gate 30 is separated from the conductive channel and the buried N+10 at the drain by the gate oxide 21, and is separated from the buried N+10 at the tunnel dielectric area 4C by the thin tunnel dielectric 22. The buried N+10 also serves as the source drain junction of the memory transistor. The access transistors 5A and 5B include the poly silicon gate 90 disposed over the conductive channel area. The poly silicon gate 90 is separated from the conductive channel of the access transistor 5A and the access transistor 5B by the gate oxide 21. The buried N+ junction 10 also serves as the source drain of the access transistor 5A and the access transistor 5B. In normal application, the access transistor 5B is of the enhancement type so that there are no leakage current conducting through the access transistor 5B when the gate 90 is at the ground potential, while the access transistor 5A could be either the enhancement type or depletion type. The isolation transistor 3 includes the poly silicon gate 590 disposed over and insulated from the channel area by the gate oxide 21. The poly silicon gate 590 is also connected to the diffusion control gate 4A of the memory device 4B by a buried contact. The access transistor 1 of the DRAM includes the poly silicon gate 490 disposed over and insulated from the channel area by the gate oxide 21. The storage capacitor 2 of the DRAM includes the poly silicon plate 390 disposed over and insulated from the buried N+ junction 10 by the gate oxide 21. The shallower junction 11 serves as the source drain junction of the isolation transistor 3 and the access transistor 1. The metal line 80 is connected to the drain of all access transistor 1 at the same row through contact 70. Similarly the metal line 81 is connected to the drain of all access transistor 5A at the same row through contact 170. The doped CVD oxide film 60 is underneath the metal to smooth out the sharp edges. The thick field oxide 20 serves as the isolation between different devices.

When a suitable positive potential is applied accross the diffusion control gate line 4A and the drain of the memory transistor, electrons are tunneled from the floating gate 30 to the diffusion control gate line 4A through the tunnel dielectric 22 at the overlapped area 4C between the floating gate and the diffusion control gate line 4A. Similarly, the application of the suitable positive potential accross the drain of the memory transistor to the diffusion control gate line 4A causes electrons to tunnel back from the diffusion control gate line 4A to the floating gate 30 of the memory transistor 4B through the tunnel dielectric 22 at the tunnel dielectric area 4C. If there are excess electrons at the floating gate 30 of the memory transistor 4B, the positive voltage required at the diffusion control gate line 4A to conduct current through the memory transistor 4B becomes higher. On the other hand, if there are deficit in electrons at the floating gate 30 of the memory transistor 4B, the positive voltage required at the diffusion control gate line 4A to conduct current through the memory transistor 4B becomes less. Therefore, whether there are current or there are no current conducting through the memory transistor 4B at a given voltage at the diffusion control gate line 4A can represent whether 1 or 0 is stored in the memory transistor 4B.

The fabrication of the Non-volatile DRAM cell shown in FIG. 22 will now be described in details. For the convenience of explanation, an N-channel MOS memory array will be used as an example. A P-type single crystal silicon will be used as the starting substrate. As in the conventional fabrication process for the N-channel MOS transistor, a CVD nitride thin film is deposited on the initial oxide grown on the P-type substrate. Then the photoresist patterns of the active area is formed on top of the nitride film, and the nitride outside of the photoresist patterns is etched off. P-type impurity Boron is then implanted into the area outside of the photoresist pattern to raise the substrate doping outside of the active area. This is done to raise the threshold voltage of the parasitic field devices to form better isolation between the active areas. The photoresist patterns are stripped off after the Boron implant, and the thick field oxide is grown outside of the active area. During the field oxidation, the active areas 25 and 125 are still protected by nitride pattern and no oxide is grown. Ater the field oxide is grown, the nitride and the initial oxide underneath the nitride in the active areas 25 and 125 are etched off to expose the substrate in the active area only. Then a high quality gate oxide 21 of 200 A to 1000 A is grown in the active areas 25 and 125.

After the high quality gate oxide 21 is grown, the threshold voltage of various transistors are adjusted by implanting proper impurity into the channel areas while using the photoresist patterns to protect the areas that do not require the adjustment. Then the photoresist patterns 26 are formed to expose the areas that require the buried N+ implant 10 in the range of 5E13 to 5E15/cm2 dose of N-type impurities such as Arsenic, Phosphorus as shown in FIG. 23A and FIG. 23B. The buried N+ implant is done after the gate oxide 21 is grown to minimize the heavy implant induced enhanced oxidation problem. After the buried N+ implant, the photoresist is stripped off. Then the photoresist pattern 29 is formed to expose the tunnel dielectric area 4C and the gate oxide 21 in the tunnel dielectric area 4C is etched off to expose the substrate area 27 as shown in FIG. 24A and FIG. 24B. The high quality thin tunnel dielectric film of 40 A to 150 A is then formed at the tunnel dielectric area 4C. Then the photoresist patterns 129 is formed to expose the buried contact area and the gate oxide 21 is etched off to expose the substrate 270 as shown in FIGS. 25A and 25B. The photoresist patterns are then stripped off and a CVD poly silicon film is deposited on the surface afterward. The poly silicon film is then doped and patterned into the floating gate 30 of the memory transistor 4B, the poly gate 90 of the access transistor 5A and the access transistor 5B, the gate 590 of the isolation transistor 3, the gate 490 of the access transistor 1, the poly silicon plate 390 of the storage capacitor 2, and the gate of periphery transistors. The remaining fabrication process steps are similar to that of the conventional N-channel transistors. After the poly silicon gate is formed, the source drain junction is implanted, doped CVD oxide film is deposited, contacts are open, and metal film is deposited and patterned.

The present invention has been set forth in the form of three preferred embodiments. Various modifications of the preferred embodiments disclosed herein may be made by those skilled in the art upon reference to this disclosure without departing from the scope and the spirit of the present invention. Moreover, such modifications are considered to be within the purview of the appended claims.

I claim:

1. An electrically alterable, non-volatile dynamic random access memory cell, which is capable of storing information as a dynamic random access memory (DRAM) and also storing information as a non-volatile memory, comprising:

an electrically erasable and electrically programmable memoy cell (EEPROM) comprising:

an MOS electrically alterable, non-volatile, floating gate type memory device (4) having a first electrode (drain), a second electrode (control gate), a third electrode (source), and a fourth electrode (floating gate), with a tunnelling region at said first electrode (drain) underneath said fourth electrode (floating gate), an MOS access transistor (5) having a first electrode (drain), a second electrode (gate), and a third electrode (source), with said third electrode (source) electrically connected to said first electrode (drain) of said floating gate type memory device (4), an MOS dynamic random access memory cell (DRAM) comprising:

an MOS access transistor (1) having a first electrode (drain), a second electrode (gate), and a third electrode (source), a capacitor (2) with a first electrode and a second electrode, with said first electrode electrically connected to said third electrode (source) of said access transistor of said DRAM (1), an MOS isolation transistor (3) having a first electrode (drain), a second electrode (gate), and a third electrode (source), with said first electrode (drain) electrically connected to said third electrode (source) of said floating gate type memory device (4), and said third electrode (source) electrically connected to said third electrode (source) of said access transistor (1) of said DRAM, whereby, by grounding said second electrode (gate) of said isolation transistor (3), said DRAM (1) and (2) is isolated from said EEPROM (4) and (5), and whereby by application of a first potential of a first polarity to said second electrode (gate) of said isolation transistor (3) and by application of a second high potential of said first polarity to said second electrode (control gate) of said floating gate type memory device (4), charge carriers tunnelled from said first electrode (drain) to said fourth electrode (floating gate) of said floating gate type memory device (4) if said third electrode (source) of said access transistor (1) of said DRAM is at ground potential, no charge carriers tunnelled from said first electrode (drain) to said fourth electrode (floating gate) of said floating gate type memory device (4) if said third electrode (source) of said access transistor (1) of said DRAM is at potential other than ground potential, and whereby by application of a third potential of said first polarity to said first electrode (drain) of said access transistor (5) of said EEPROM and by application of a fourth potential of said first polarity at said second electrode (gate) of said access transistor (5) of said EEPROM, said second electrode (control gate) of said floating gate type memory device (4), and said second electrode (gate) of said isolation transistor (3), a potential at said third electrode (source) of said access transistor (1) of said DRAM is restored, and whereby by grounding said second electrode (gate) of said isolation transistor (3) and said second electrode (control gate) of said floating gate type memory device (4), and by application of fifth high potential of said first polarity at said first electrode (drain) and said second electrode (gate) of said access transistor (5) of said EEPROM, charge carriers tunnelled from said fourth electrode (floating gate) to said first electrode (drain) of said floating gate type memory device (4).

2. An electrically alterable, non-volatile dynamic random access memory cell, which is capable of storing information as a dynamic random access memory (DRAM) and also storing information as a non-volatile memory, comprising:

an electrically erasable and electrically programmable memoy cell (EEPROM) comprising:

an MOS electrically alterable, non-volatile, floating gate type memory device (4) having a first electrode (drain), a second electrode (control gate), a third electrode (source), and a fourth electrode (floating gate), with a tunnelling region between said second electrode (control gate) and said fourth electrode (floating gate), an MOS access transistor (5) having a first electrode (drain), a second electrode (gate), and a third electrode (source), with said third electrode (source) electrically connected to said first electrode (drain) of said floating gate type memory device (4), an MOS dynamic random access memory cell (DRAM) comprising:

an MOS access transistor (1) having a first electrode (drain), a second electrode (gate), and a third electrode (source), a capacitor (2) with a first electrode and a second electrode, with said first electrode electrically connected to said third electrode (source) of said access transistor of said DRAM (1), an MOS isolation transistor (3) having a first electrode (drain), a second electrode (gate), and a third electrode (source), with said first electrode (drain) electrically connected to said third electrode (source) of said floating gate type memory device (4), and said third electrode (source) electrically connected to said third electrode (source) of said access transistor (1) of said DRAM.

3. The non-volatile DRAM cell defined by claim 1 or claim 2 wherein said second electrode (gate) of said isolation transistor (3) is electrically connected to said second electrode (control gate) of said floating gate type memory device (4) of said EEPROM.

4. The non-volatile DRAM cell defined by claim 1 or claim 2 wherein said first electrode (drain) and said second electrode (gate) of said access transistor (5) of said EEPROM are electrically connected.

5. The non-volatile DRAM cell defined by claim 1 or claim 2 wherein said first electrode (drain) and said second electrode (gate) of said access transistor (5) of said EEPROM are electrically connected, and said second electrode (gate) of said isolation transistor (3) and said second electrode (control gate) of said floating gate type memory device (4) are electrically connected.

6. An electrically alterable, non-volatile dynamic random access memory cell, which is capable of storing information as a dynamic random access memory (DRAM) and also storing information as a non-volatile memory, comprising:

an electrically erasable and electrically programmable memoy cell (EEPROM) comprising:

an MOS electrically alterable, non-volatile, floating gate type memory device (4) having a first electrode (drain), a second electrode (control gate), a third electrode (source), and a fourth electrode (floating gate), with a tunnelling region at said first electrode (drain) underneath said fourth electrode (floating gate), said floating gate type memory device (4) comprising a substrate of semiconductor material having a channel region of a first type of conductivity between a first (drain) and a second region (source) of a second type of conductivity, formed at the surface of said semiconductor substrate, said channel region providing a region within the semiconductor capable of passing an electric current between said first (drain) and said second region (source), a first level of patterned conducting material, constituting said fourth electrode (floating gate), extending over said channel region, substantially between said first (drain) and said second region (source) and electrically insulated by means of a first layer of dielectric material from said semiconductor substrate and by means of a second layer of dielectric material from a second level of patterned conducting material, constituting a control gate, overlying said floating gate and which further includes a tunnel area defined on the surface of said first region (drain) of the semiconductor substrate, said tunnel area being bordered on the side by the base of a portion of the length of a side wall of said floating gate and being covered with a third layer of dielectric material thinner than said first layer of dielectric material;

a tapered, lateral, seamlike appendix of conducting material juxtaposed along said portion of the length of the side wall of said fourth electrode (floating gate), the base of said juxtaposed, tapered, lateral, seamlike appendix of conducting material abutting on the surface of said third layer of dielectric material covering said tunnel area;

said seamlike appendix being electrically connected to said patterned first level of conducting material constituting said fourth electrode (floating gate) along the entire periphery of said fourth electrode (floating gate), an MOS access transistor (5) having a first electrode (drain), a second electrode (gate), and a third electrode (source), with said third electrode (source) electrically connected to said first electrode (drain) of said floating gate type memory device (4), an MOS dynamic random access memory cell (DRAM) comprising:

an MOS access transistor (1) having a first electrode (drain), a second electrode (gate), and a third electrode (source), a capacitor (2) with a first electrode and a second electrode, with said first electrode electrically connected to said third electrode (source) of said access transistor of said DRAM (1), an MOS isolation transistor (3) having a first electrode (drain), a second electrode (gate), and a third electrode (source), with said first electrode (drain) electrically connected to said third electrode (source) of said floating gate type memory device (4), and said third electrode (source) electrically connected to said third electrode (source) of said access transistor (1) of said DRAM.

7. The device of claim 6, wherein said third layer of dielectric material in said floating gate type memory device has a thickness of between 40 Angstroms and 150 Angstroms.

8. The device of claim 6, wherein said seamlike appendix and said patterned first level of conducting material in said floating gate type memory device are both composed of doped polycrystalline silicon.

9. The device of claim 6, wherein second type of conductivity in said floating gate type memory device is N type.

10. The device of claim 6, wherein said first layer of dielectric material and said third layer of dielectric material in said floating gate type memory device are oxide layers.

11. The device of claim 8, wherein said second type of conductivity in said floating gate type memory device is N type, and said polycrystalline silicon is doped N type.

12. The device of claim 7, wherein said first layer of dielectric material in said floating gate type memory device has a thickness of between 200 Angstroms and 1000 Angstroms.

13. A memory array having a plurality of electrically alterable, non-volatile dynamic random access memory cells, each as defined in claim 1 or claim 6, wherein the memory cells are arranged in rows and columns in a matrix, with one word line extending along each row, the gate electrode of each access transistor of DRAM in a row being connected to a corresponding row word line, and with one bit line extending along each column, the drain electrode of each access transistor of DRAM in a column being connected to the corresponding bit line, and with one program (1) line extending along every two columns, the drain electrode and the gate electrode of each access transistor of EEPROM in both columns being connected to the corresponding program (1) line, and with one program (2) line extending along every two columns, the gate of each isolation transistor and the control gate of each floating gate type memory device of EEPROM in both columns being connected to the corresponding program (2) line.

14. A memory array having a plurality of electrically alterable, non-volatile dynamic random access memory cells, each as defined in claim 1 or claim 6, wherein the memory cells are arranged in rows and columns in a matrix, with one word line extending along each row, the gate electrode of each access transistor of DRAM in a row being connected to a corresponding row word line, and with one bit line extending along each column, the drain electrode of each access transistor of DRAM in a column being connected to the corresponding bit line, and with one program (1) line extending along every two rows, the drain electrode and the gate electrode of each access transistor of EEPROM in both rows being connected to the corresponding program (1) line, and with one program (2) line extending along every two rows, the gate of each isolation transistor and the control gate of each floating gate type memory device of EEPROM in both rows being connected to the corresponding program (2) line.

* * * * *